United States Patent
Konopka

[19]

[11] Patent Number: 5,528,147
[45] Date of Patent: Jun. 18, 1996

[54] APPARATUS FOR DETECTING GAS DISCHARGE LAMP FAULTS

[75] Inventor: John G. Konopka, Barrington, Ill.

[73] Assignee: Motorola Lighting, Inc., Buffalo Grove, Ill.

[21] Appl. No.: 269,467

[22] Filed: Jun. 30, 1994

[51] Int. Cl.⁶ .................................................. G01R 31/00
[52] U.S. Cl. ........................... 324/403; 324/410; 315/122; 315/225; 445/63
[58] Field of Search ..................................... 324/403, 405, 324/406, 410, 411, 414; 315/129, 127, 225, 244, 307, 122; 445/3, 63

[56] References Cited

U.S. PATENT DOCUMENTS 2,904,746   9/1959   Anderson ........................... 324/414
5,089,753   2/1992   Mattas ................................ 315/225 X

*Primary Examiner*—Kenneth A. Wieder
*Assistant Examiner*—Diep Do
*Attorney, Agent, or Firm*—J. Ray Wood

[57] ABSTRACT

A capacitor (16) coupled in series with series coupled gas discharge lamps (11 and 12) will effectively block direct current from flowing through the capacitor (16). A detector circuit including a high impedance resistor (17) and transistor (18) provide an alternate path for a small direct current flow, thereby enabling a direct current voltage across the capacitor (16) to be detected. The presence or absence of this direct current voltage provides a reliable indicia of the existence or absence of a gas discharge fault.

9 Claims, 1 Drawing Sheet

APPARATUS FOR DETECTING GAS DISCHARGE LAMP FAULTS

The technical field of this invention relates generally to gas discharge lamps and control circuits therefor.

BACKGROUND OF THE INVENTION

Gas discharge lamps are well known in the art. When gas discharge lamps are coupled in series, various problems can develop when a gas discharge lamp fault develops (for example, when one of the lamps become inoperative, is removed, or otherwise displays faulty operation).

Because of this, it is known in the art that, upon detecting a gas discharge lamp fault, various corrective actions can be taken. To date, prior art gas discharge lamp fault detector have been, in one way or another, inadequate. For example, existing detectors are unreliable, costly, or suffer other undesirable attributes.

Accordingly, a need exists for a reliable, cost effective gas discharge lamp fault and missing lamp detector.

DESCRIPTION OF THE PREFERRED EMBODIMENTS

Figure 1:
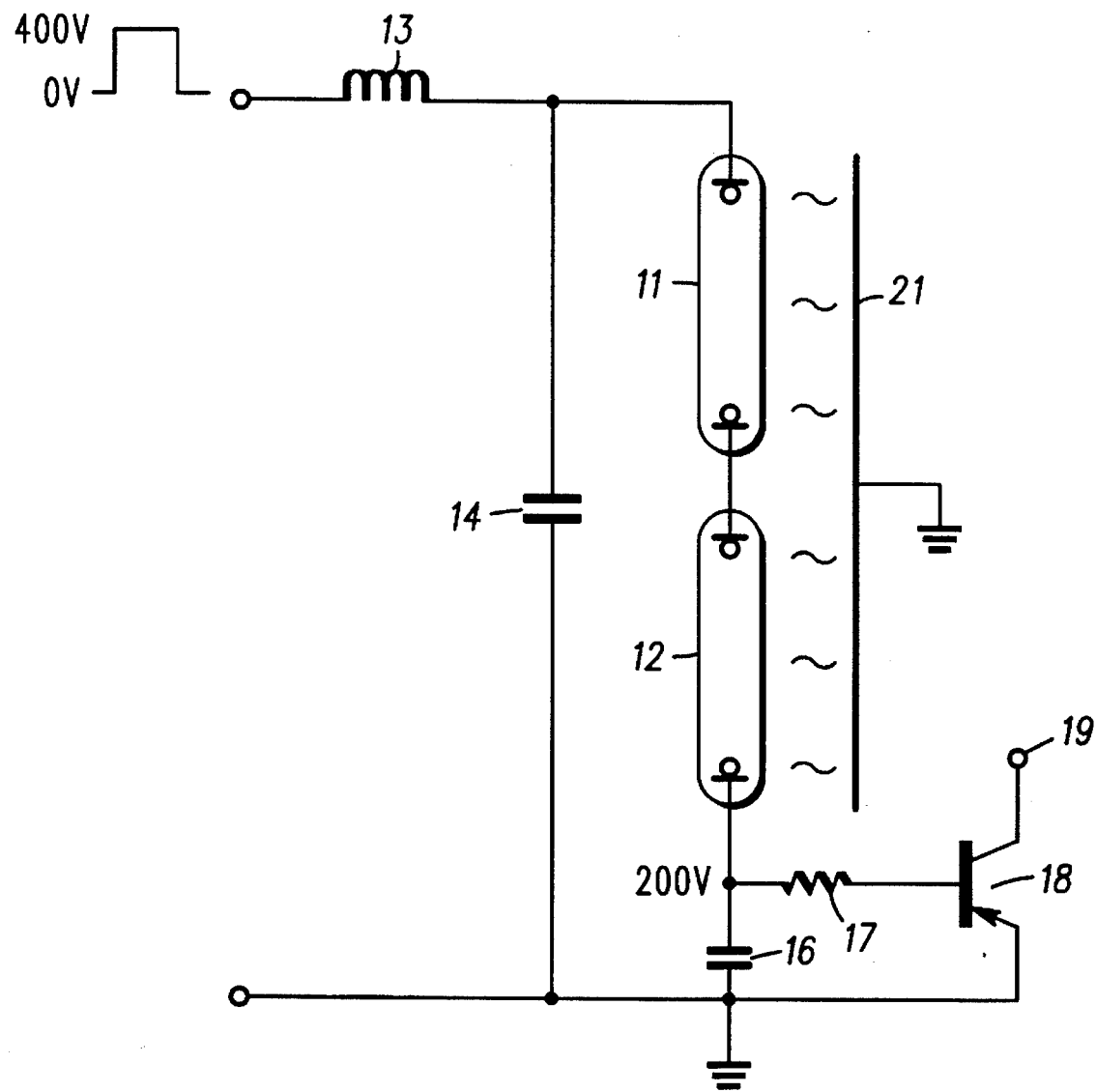
FIG. 1 comprises a schematic depiction of a gas discharge lamp fault detector in combination with a gas discharge lamp circuit, all in accordance with the invention.

As shown in FIG. 1 two gas discharge lamps 11 and 12 are coupled in series with one another. These lamps 11 and 12 are coupled to a resonant circuit comprising an inductor 13 and a capacitor 14, in accordance with well understood prior art technique. Also in accordance with prior art technique, a positive going 400 volt square wave signal is input to the resonant circuit in order provide effective energization of the lamps 11 and 12.

A capacitor 16 is coupled in series with the lamps 11 and 12. In this particular embodiment, this capacitor 16 has a value of 0.33 mF (microfarads), but any value can be selected so long as the resultant impedance is low with respect to the operating frequency of the lamps 11 and 12. In this embodiment, the lamp operating frequency is 37 KHz (kilohertz). So configured, alternating current will flow readily through the series combined lamps 11 and 12 and capacitor 16, but direct current will lo be blocked by the capacitor 16 (once, of course, the capacitor 16 has become fully charged).

A high impedance resistor 17 (in this embodiment, having a value of 220 kilo ohms) connects between the lamps 11 and 12 and the capacitor 16, and provides a path to a transistor 18, all configured and coupled as depicted. The collector of the transistor 18 comprises a fault detector output 19.

So configured, the open circuit presented by the capacitor 16 to the direct current component passing through the lamps 11 and 12 will effectively block the flow of direct current, while the high impedance path presented by the resistor 17 and transistor 18 combination will allow a small flow of direct current (in this embodiment, on the order of one milliamp). So long as both lamps 11 and 12 remain in place and operational, approximately 200 volts DC (direct current) will be present across the capacitor 16. This voltage is readily detected by the resistor 17 and transistor 18 combination. When a fault develops, direct current will stop, and this condition will similarly be detected by the resistor 17 and transistor 18 combination, within an appropriate representative signal corresponding thereto being provided to the detector output 19.

When a fault develops, alternating current can continue to flow through the remaining operative lamp, since a high frequency alternating current path exist between the corresponding lamp and the housing 21 of the lamp housing. This path, of course, will block direct current, and hence the above described operation of the detector remains true under these conditions.

So configured, relatively few and simple components are utilized to reliably and quickly detect the existence of a gas discharge lamp fault. The resultant detector output can then be utilized in a variety of ways as understood in the art.

I claim:

1. A fault detection circuit for use with series connected gas discharge lamps powered from a source of alternating voltage, comprising:

A) a capacitor coupled in series with the series connected gas discharge lamps;

B) a direct current voltage detector having at least one resistor coupled in parallel with the capacitor.

2. The fault detection circuit of claim 1, wherein the resistor comprises a high impedance resistor to significantly minimize direct current flow through the series connected gas discharge lamps to prevent polarization of gases within the gas discharge lamps.

3. The fault detection circuit of claim 2, wherein the direct current voltage detector further includes a transistor that is coupled to the resistor.

4. The fault detection circuit of claim 3, wherein the transistor has a base, and the base couples to the resistor.

5. A circuit for powering series connected gas discharge lamps comprising:

a source of alternating voltage;

a resonant circuit coupled to the source, the resonant circuit having an inductor and a first capacitor;

a second capacitor coupled in series with the gas discharge lamps;

the second capacitor and the gas discharge lamps coupled in parallel with the first capacitor; and a direct current voltage detector coupled in parallel with the second capacitor for detecting a fault condition.

6. The circuit of claim 5, wherein the direct current voltage detector includes a resistor that is coupled to the capacitor.

7. The circuit of claim 6, wherein the resistor comprises a high impedance resistor to significantly minimize direct current flow through the series connected gas discharge lamps to prevent polarization of gases within the gas discharge lamps.

8. The circuit of claim 7, wherein the direct current voltage detector further includes a transistor that is coupled to the resistor.

9. The circuit of claim 8, wherein the transistor has a base, and the base couples to the resistor.

* * * * *